United States Patent
Sattler

(10) Patent No.: US 10,377,005 B2
(45) Date of Patent: Aug. 13, 2019

(54) ADAPTIVE POWER DISPLAY

(71) Applicant: Hilti Aktiengesellschaft, Schaan (LI)

(72) Inventor: Christian Sattler, Biessenhofen (DE)

(73) Assignee: Hilti Aktiengesellschaft, Schaan (LI)

( * ) Notice: Subject to any disclaimer, the term of this patent is extended or adjusted under 35 U.S.C. 154(b) by 312 days.

(21) Appl. No.: 15/123,941

(22) PCT Filed: Mar. 6, 2015

(86) PCT No.: PCT/EP2015/054703
§ 371 (c)(1),
(2) Date: Sep. 6, 2016

(87) PCT Pub. No.: WO2015/132376
PCT Pub. Date: Sep. 11, 2015

(65) Prior Publication Data
US 2017/0274487 A1    Sep. 28, 2017

(30) Foreign Application Priority Data

Mar. 7, 2014 (EP) .................................... 14158235

(51) Int. Cl.
*F16H 3/00* (2006.01)
*B23Q 5/14* (2006.01)
(Continued)

(52) U.S. Cl.
CPC .............. *B23Q 5/142* (2013.01); *B23B 35/00* (2013.01); *B25F 5/00* (2013.01); *B25F 5/001* (2013.01);
(Continued)

(58) Field of Classification Search
CPC ................................ B23B 35/00; F16H 3/005
See application file for complete search history.

(56) References Cited

U.S. PATENT DOCUMENTS

| | | | |
|---|---|---|---|
| 8,225,699 B2 | 7/2012 | Yang | |
| 8,888,655 B2 * | 11/2014 | Saur | .......................... B25F 5/00 477/107 |
| 9,193,055 B2 * | 11/2015 | Lim | ........................ B25F 5/001 |
| 9,889,548 B2 * | 2/2018 | Sattler | ..................... B25F 5/001 |
| 2013/0165292 A1 | 6/2013 | Brugger et al. | |

(Continued)

FOREIGN PATENT DOCUMENTS

| DE | 3433552 | 3/1986 |
|---|---|---|
| DE | 10348756 | 5/2005 |

(Continued)

*Primary Examiner* — Derek D Knight
(74) *Attorney, Agent, or Firm* — Davidson, Davidson & Kappel, LLC

(57) ABSTRACT

A method to control a power tool, especially a core drill, including a motor as the drive for the power tool, a control unit, a power display, a transmission having at least a first gear and a second gear, a first sensor to detect the rotational speed of at least one component of the transmission and a second sensor to detect the rotational speed of the motor. The method includes the following steps: ascertaining a first rotational speed of the at least one component of the transmission when the transmission has been put into a gear, ascertaining a first rotational speed of the motor when the transmission has been put into a gear, ascertaining the selection of the gear on the basis of a first prescribed ratio of the first rotational speed of the at least one component of the transmission and of the first rotational speed of the motor on the basis of a look-up table, and setting the limit value of the power display on the basis of the look-up table as a function of the gear that has been selected. A power tool for purposes of using the method.

4 Claims, 2 Drawing Sheets

(51) Int. Cl.
*B25F 5/00* (2006.01)
*B23B 35/00* (2006.01)
*B28D 1/04* (2006.01)
*B28D 7/00* (2006.01)
*F16H 3/44* (2006.01)
*H03K 5/08* (2006.01)
*G01P 3/00* (2006.01)

(52) U.S. Cl.
CPC ............ *B28D 1/041* (2013.01); *B28D 7/005* (2013.01); *F16H 3/005* (2013.01); *F16H 3/44* (2013.01); *H03K 5/082* (2013.01); *B23B 2260/07* (2013.01); *B23B 2260/128* (2013.01); *B23B 2270/486* (2013.01); *G01P 3/00* (2013.01)

(56) References Cited

U.S. PATENT DOCUMENTS

2014/0028226 A1   1/2014   Mergener et al.
2017/0014985 A1*  1/2017   Sattler .................... B25F 5/001

FOREIGN PATENT DOCUMENTS

| DE | 202009018270 | 9/2011 |
| DE | 102011089771 | 6/2013 |
| JP | S63102879 | 5/1988 |
| JP | H05200652 | 8/1993 |
| JP | 2003039423 | 2/2003 |
| JP | 2011000654 | 1/2011 |
| JP | 2011075098 | 4/2011 |
| JP | 2013226624 | 11/2013 |

* cited by examiner

ADAPTIVE POWER DISPLAY

The present invention relates to a method to control a power tool, especially a core drill, comprising a motor as the drive for the power tool, a control unit, a power display, a transmission having at least a first gear and a second gear, a first sensor to detect the rotational speed of at least one component of the transmission and a second sensor to detect the rotational speed of the motor.

Moreover, the invention relates to a power tool, especially a core drill, comprising a motor as the drive for the power tool, a control unit, a power display, a transmission having at least a first gear and a second gear, a first sensor to detect the rotational speed of at least one component of the transmission and a second sensor to detect the rotational speed of the motor, for purposes of using the method according to the invention.

BACKGROUND

Power tools such as, for example, core drills, generally serve to drill holes into mineral materials such as for instance, concrete or bricks. In this context, the core drill normally has an electric motor, a transmission, a control unit or control device, a tool socket as well as a tool in the form of a core bit. Via the transmission, the electric motor drives the tool socket together with the tool. The transmission normally has two gears as well as a no-load state, which can be selected or actuated manually by the user of the core drill. By means of the individual gears, the motor speed is stepped up or down to the drive speed in different ways. In this manner, depending on the transmission ratio, either a high rotational speed and a low torque, or else a low rotational speed and a high torque can be available at the core bit. Once the core bit has been made to rotate, it cuts a circular hole into the material by means of its diamond-tipped cutting edge, thereby creating a cylindrical drill core. This drill core is removed from the drilled hole at the end of the drilling or cutting procedure.

A core drill according to the state of the art is disclosed in German patent application DE 10 2011 089 771. This power tool configured as a core drill comprises a drive means with a drive motor and a drive shaft, a driven means with a driven shaft, a transmission with a planetary gear train and an additional gear unit as well as a device for changing between a first and a second gear speed step of the planetary gear train.

SUMMARY OF THE INVENTION

A widespread problem encountered with core drills according to the state of the art is that the limit values for the overload ranges are dimensioned on the basis of the gear that rotates most slowly (that is to say, the highest gear). These limit values, however, are not coordinated with the gears that rotates most quickly (that is to say, the lowest gears). The display of a limit value that is not coordinated with the gear that is currently selected can lead to improper operation of the power tool and to diminished productivity as a result of lower drilling speeds and/or a shortened service life of the power tool.

It is an object of the present invention to solve the above-mentioned problem and provide a method to control a power tool, especially a core drill, as well as to put forward a power tool, especially a core drill, that uses this method, so that greater productivity can be attained when the power tool is used.

For this purpose, a method is shown to control a power tool, especially a core drill, comprising:
- a motor as the drive for the power tool;
- a control unit;
- a power display;
- a transmission having at least a first gear and a second gear;
- a first sensor to detect the rotational speed of at least one component of the transmission; and
- a second sensor to detect the rotational speed of the motor.

According to the invention, the following method steps are provided:
- ascertaining a first rotational speed of the at least one component of the transmission when the transmission has been put into a gear,
- ascertaining a first rotational speed of the motor when the transmission has been put into a gear,
- ascertaining the selection of the gear on the basis of a first prescribed ratio of the first rotational speed of the at least one component of the transmission and of the first rotational speed of the motor on the basis of a look-up table, and
- setting the limit value of the power display on the basis of the look-up table as a function of the gear that has been selected.

Thanks to the appropriate automatic adaptation of the limit value of the power display to the gear that is currently selected, the user is always able to employ the power tool in the appropriate power range in order to increase the productivity.

Moreover, a power tool is shown, especially a core drill, comprising:
- a motor as the drive for the power tool;
- a control unit;
- a power display;
- a transmission having at least a first gear and a second gear;
- a first sensor to detect the rotational speed of at least one component of the transmission; and
- a second sensor to detect the rotational speed of the motor, for purposes of using the method according to the invention.

BRIEF DESCRIPTION OF THE DRAWINGS

Additional advantages can be gleaned from the figure description below. The figures depict various embodiments of the present invention. The figures, the description and the claims contain numerous features in combination. Whenever appropriate, the person skilled in the art will also consider the features individually and unite them to create additional meaningful combinations The following is shown:

DETAILED DESCRIPTION

Figure 1:
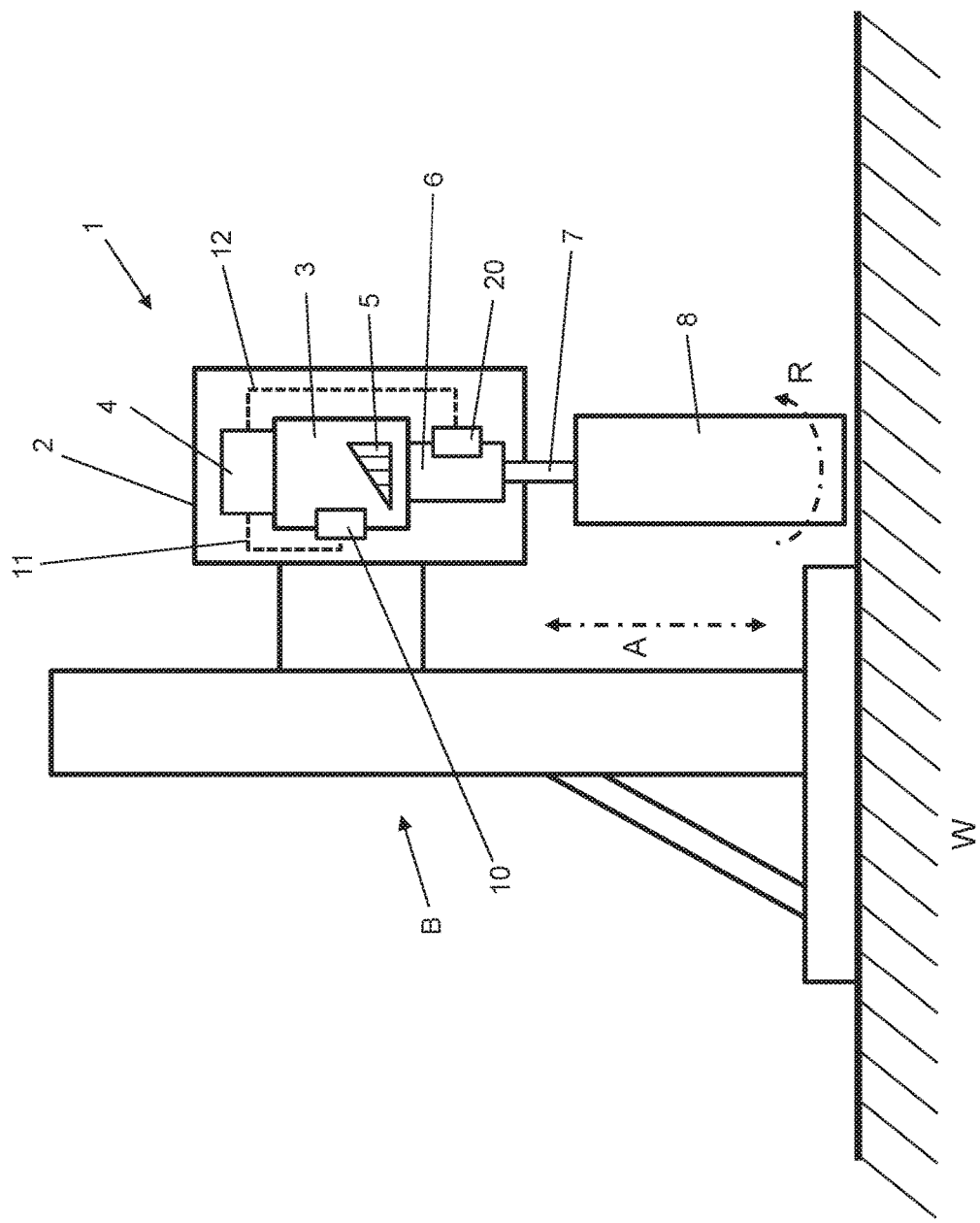
FIG. 1: a power tool configured as a core drill according to the invention, comprising a motor, a control unit, a transmission, a tool configured as a core bit, a first sensor and a second sensor.

FIG. 1 shows a power tool 1 configured as a core drill that is attached to a drill stand 2. By means of the drill stand 2, the core drill 1 can be reversibly moved along the double-arrow direction A towards as well as away from the workpiece W that is to be worked. The material W is concrete.

The core drill 1 has a housing 2, a motor 3, a control unit 4, a power display 5, a transmission 6, a driven shaft 7, a tool 8 configured as a core bit, a first sensor 10 to detect the rotational speed of the transmission 6 and a second sensor 20 to detect the rotational speed of the motor 3. Any type of electric motor can be used as the motor 3.

The motor 3 is configured as an electric motor and it serves to drive the core bit 8. The motor 3 has a drive shaft that is detachably connected to the transmission 6. This connection is established by a coupling means. The core bit 8 is made to rotate by means of the transmission 6 and the driven shaft 7. The torque generated in the motor 3 is thus correspondingly transmitted to the core bit 8 in order to cut a hole into the material W.

The transmission 6 has a first gear, a second gear as well as a no-load state, and it is positioned between the drive shaft of the motor 3 and the driven shaft 7. The individual gears can be selected manually by means of a gear-speed selector in order to thus vary the transmission of the rotational speed and of the torque from the motor 3 to the driven shaft 7 or to the core bit 8.

The first sensor 10 is positioned on the transmission 6 in such a way as to detect the rotational speed of at least one component of the transmission 6 relative to the gear that is currently selected. The at least one component of the transmission 6 can be a gear wheel or the like. The second sensor 20, in contrast, is positioned in such a way as to detect that the rotational speed of the motor 3.

The control unit 4 is connected to the first sensor 10 via a first line 11 and to the second sensor 20 via a second line 12, and this is done in such a way that that rotational speed values measured by the sensors 10, 20 are transmitted to the control unit 4. Moreover, the control unit 4 is connected to the motor 3 in such a way that the control unit 4 can vary the rotational speed of the motor 3 directly. Moreover, the control unit 4 is also connected to the power display 5 in such a way that the limit values of the power display 5 can be varied (that is to say, increased or decreased). The control unit 4 has a data memory unit where a look-up table (transmission ratio table) is stored. The gear that is currently selected can be ascertained with this look-up table on the basis of the ratio of the rotational speed of the motor 3 and of the corresponding rotational speed of the transmission 6. Thanks to the connection of the control unit 4 to the motor 3, the control unit 4 can act upon the motor 3, that is to say, it can automatically increase or decrease the rotational speed of the motor 3.

The power display 5 serves to inform the user about the current power level of the core drill 1, that is to say, especially to warn the user against an overload of the core drill 1. For this purpose, the power display 5 is visibly positioned on the housing 2 of the core drill 1 in such a way that the user can see it while working with the core drill 1. The power display 5 comprises a visual scale (graduation) with which the power range and especially the overload range pertaining to the currently selected gear is displayed. As an alternative or in addition to the visual scale, an acoustic display device can be provided which can indicate when the overload range has been reached and especially when it has been exceeded.

Figure 2:
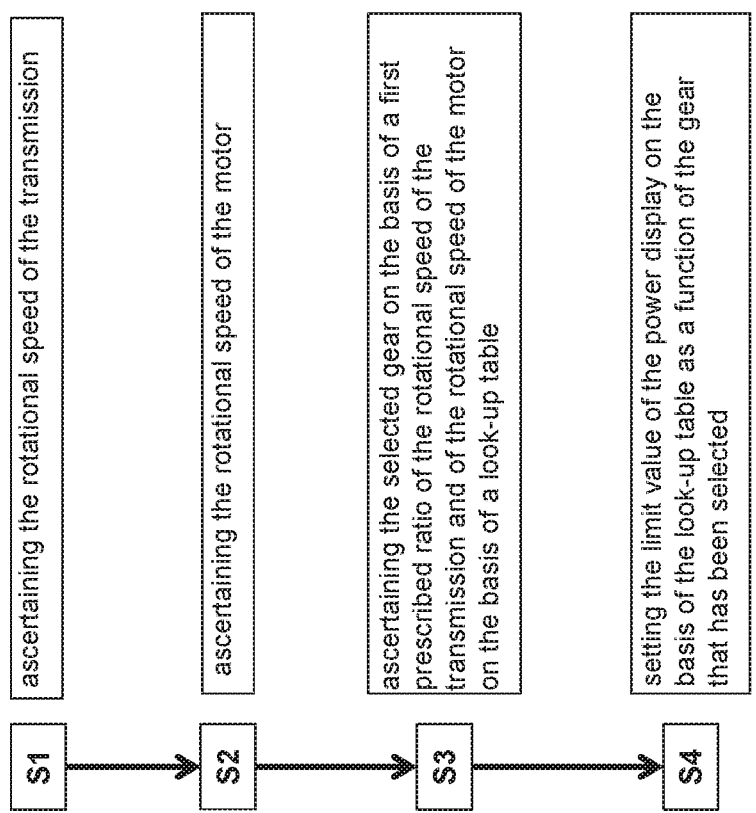
FIG. 2: a first flow chart of the method according to the invention.

FIG. 2 shows the course of the adaptation of the limit value to the selected gear on the basis of the method according to the invention.

Towards this end, in step S1, the first sensor 10 ascertains the rotational speed of the transmission 6.

In step S2, the rotational speed of the motor 3 is ascertained by the second sensor 20.

In step S3, the selected gear is ascertained on the basis of the look-up table stored in the data memory unit as well as on the basis of the ascertained rotational speed of the motor 3 and of the transmission 6.

In step S4, the limit value of the power display 5 is selected on the basis of the look-up table as a function the gear that has been selected.

What is claimed is:

1. A method to control a power tool including a motor as a drive for the power tool; a controller; a power display; a transmission having a plurality of gears including at least a first gear and a second gear; a first sensor to detect a rotational speed of at least one component of the transmission; and a second sensor to detect a motor rotational speed of the motor, the method comprising the following steps:
   ascertaining a first rotational speed of the at least one component of the transmission when the transmission has been put into one of the plurality of gears,
   ascertaining a first rotational speed of the motor when the transmission has been put into the one gear,
   ascertaining a selection of the one gear as a function of a first prescribed ratio of the first rotational speed of the at least one component of the transmission and of the first rotational speed of the motor on the basis of at least one look-up table, and
   setting a limit value of a power display on the basis of the at least one look-up table as a function of the ascertained selection of the one gear.

2. A method to control a core drill including a motor as a drive for the core drill; a controller; a power display; a transmission having a plurality of gears including at least a first gear and a second gear; a first sensor to detect a rotational speed of at least one component of the transmission; and a second sensor to detect a motor rotational speed of the motor, the method comprising the following steps:
   ascertaining a first rotational speed of the at least one component of the transmission when the transmission has been put into one of the plurality of gears,
   ascertaining a first rotational speed of the motor when the transmission has been put into the one gear,
   ascertaining a selection of the one gear as a function of a first prescribed ratio of the first rotational speed of the at least one component of the transmission and of the first rotational speed of the motor on the basis of at least one look-up table, and
   setting a limit value of a power display on the basis of the at least one look-up table as a function of the ascertained selection of the one gear.

3. A power tool performing the method of claim 1.

4. A core drill performing the method of claim 2.

\* \* \* \* \*